(12) United States Patent
Matsumoto

(10) Patent No.: US 7,164,399 B2
(45) Date of Patent: Jan. 16, 2007

(54) DISPLAY DEVICE

(75) Inventor: Shoichiro Matsumoto, Ogaki (JP)

(73) Assignee: Sanyo Electric Co., Ltd. (JP)

( * ) Notice: Subject to any disclaimer, the term of this patent is extended or adjusted under 35 U.S.C. 154(b) by 428 days.

(21) Appl. No.: 10/448,991

(22) Filed: May 29, 2003

(65) Prior Publication Data

US 2004/0027343 A1    Feb. 12, 2004

(30) Foreign Application Priority Data

May 30, 2002    (JP) ............................. 2002-158171

(51) Int. Cl.
*G09G 3/30*    (2006.01)

(52) U.S. Cl. ................ 345/76; 345/204; 345/211; 315/169.3; 257/59; 257/72

(58) Field of Classification Search ............ 345/76–83, 345/204, 211; 315/169.3; 257/350, 351, 257/59, 72, 83; 348/800–801
See application file for complete search history.

(56) References Cited

U.S. PATENT DOCUMENTS

| 6,307,322 | B1 * | 10/2001 | Dawson et al. .......... 315/169.1 |
|---|---|---|---|
| 6,674,245 | B1 | 1/2004 | Ko et al. |
| 6,674,246 | B1 * | 1/2004 | Moisin ..................... 315/224 |
| 6,690,033 | B1 * | 2/2004 | Yamazaki et al. ............ 257/72 |
| 6,777,710 | B1 * | 8/2004 | Koyama ...................... 257/59 |
| 6,777,887 | B1 * | 8/2004 | Koyama .................. 315/169.3 |
| 6,791,129 | B1 * | 9/2004 | Inukai ........................ 257/208 |
| 6,798,405 | B1 * | 9/2004 | Anzai ......................... 345/205 |
| 6,909,240 | B1 * | 6/2005 | Osame et al. ............. 315/169.1 |
| 6,940,476 | B1 * | 9/2005 | Ko .............................. 345/76 |
| 2003/0122497 | A1 | 7/2003 | Ko et al. |
| 2004/0159845 | A1 * | 8/2004 | Matsumoto .................. 257/88 |

* cited by examiner

*Primary Examiner*—Lun-Yi Lao
(74) *Attorney, Agent, or Firm*—Cantor Colburn LLP

(57) ABSTRACT

A power supply line VL is formed with a protruding portion. Contacts are formed in this portion and a drain region of a second transistor is connected to the contact. Because the contacts are provided off line from a primary current flow path of the power supply line, a low resistance can be maintained in the power supply line VL.

4 Claims, 5 Drawing Sheets

DISPLAY DEVICE

BACKGROUND OF THE INVENTION

1. Field of the Invention

The present invention relates to a display device having a plurality of current driven self-emitting elements such as, for example, an organic electroluminescence element, and wherein display is realized by controlling the electric current to the self-emitting elements.

2. Description of the Related Art

Because electroluminescence (hereinafter simply referred to as "EL") display devices wherein an EL element which is a self-emitting element is used as an emissive element in each pixel have advantages, such as that the device is self-emitting, that the thickness can be reduced, and that the power consumption is small, they have attracted much attention as alternative to conventional display devices such as liquid crystal display (LCD) and CRT (cathode ray tube) display devices, and, consequently, a great deal of effort is focused on development of EL display devices.

In particular, active matrix EL display devices in which one or more switching elements such as a thin film transistor (hereinafter simply referred to as "TFT") for individually controlling the EL element are provided in each pixel and an EL element for each pixel is controlled are highly expected to become available as high resolution display devices.

FIG. 4 shows a circuit structure in each pixel in an active matrix EL display device having m rows and n columns. In an EL display device, a plurality of gate lines GL extend along the row direction on a substrate and a plurality of data lines DL and driving power supply lines VL extend along the column direction on the substrate. Each pixel has an organic EL element 50, a switching TFT (first TFT) 10, an EL element driving TFT (second TFT) 21, and a storage capacitor Cs.

The first TFT 10 is connected to a gate line GL and a data line DL and is switched on when a gate signal (selection signal) is received at its gate. When the first TFT is switched on, a data signal supplied on the data line DL is stored in the storage capacitor Cs which is connected between the first TFT 10 and the second TFT 21. A voltage corresponding to the data signal supplied through the first TFT 10 is supplied to the gate electrode of the second TFT 21 and the second TFT 21 supplies a current corresponding to the supplied voltage value from the power supply line VL to the organic EL element 50. In the organic EL element, holes injected from an anode and electrons injected from a cathode recombine within an emissive layer to excite emissive molecules and light is emitted as the excited molecules return from the excited state to the ground state. The emission brightness of the organic EL element 50 is approximately proportional to the current supplied to the organic EL element 50. Thus, by controlling the current flowing through the organic EL element 50 corresponding to the data signal in each pixel as described above, light of a brightness corresponding to the data signal is emitted from the organic EL element, and a desired image is displayed by the overall display device.

As described, an organic EL element 50 is a current driven element and requires that a sufficient amount of current be supplied from the power supply line VL through the second TFT to the organic EL element 50. In addition, a plurality of organic EL elements 50 are connected to a power supply line VL. Therefore, in order to supply a sufficient amount of current to these organic EL elements 50, the power supply line VL must have sufficient current supply capability. In order to connect the power supply line VL and a second TFT 21, a contact is employed. That is, a drain region of the second TFT and the power supply line VL are provided at different positions in the thickness direction and a contact formed extending in the thickness direction is used to connect these components.

As the contact, a conductive material is layered within a contact hole along the inner surface of the contact hole. Because of this, the length of the current path from the power supply line VL through the contact becomes long. Because the size of the contact is usually smaller than the width of the power supply line VL, a portion of the power supply line VL remains around the contact, the portion having a very small area. Therefore, there had been a problem in that formation of the contact results in an increase in the resistance in the power supply line VL.

Although, on the other hand, a power supply line VL having a sufficient width is employed, no such problem is created, a power supply line having a minimum width is demanded in order to achieve higher resolution and higher aperture ratio in each pixel.

SUMMARY OF THE INVENTION

An advantage of the present invention is that a relatively narrow width is employed as the width of the power supply line VL while a significant increase in the resistance is prevented.

According to one aspect of the present invention, a contact is not placed in the portion through which current from a power supply line primarily flows. Therefore, it is possible to maintain low resistance for the power supply line VL and maintain sufficient supply of current to the organic EL element 50 in each pixel. Consequently, it is possible to set the width of the power supply line VL to a relatively narrow width and the aperture ratio which is the ratio of the emissive area to the overall area can be improved.

According to another aspect of the present invention, because a portion of the gate line is placed below the power supply line, the aperture ratio can be improved.

According to yet another aspect of the present invention, a portion of the power supply line is extended to a region above the semiconductor layer and the contact is formed in that region, allowing the semiconductor layer to be remain in an approximate straight shape. With such a structure, the length of the semiconductor layer can be reduced compared to a case wherein the semiconductor layer is formed extending to a region below the power supply line, and, consequently, the electrical resistance of the semiconductor layer can be reduced, resulting in more reliable operation of the second TFT.

DESCRIPTION OF PREFERRED EMBODIMENT

Figure 1:
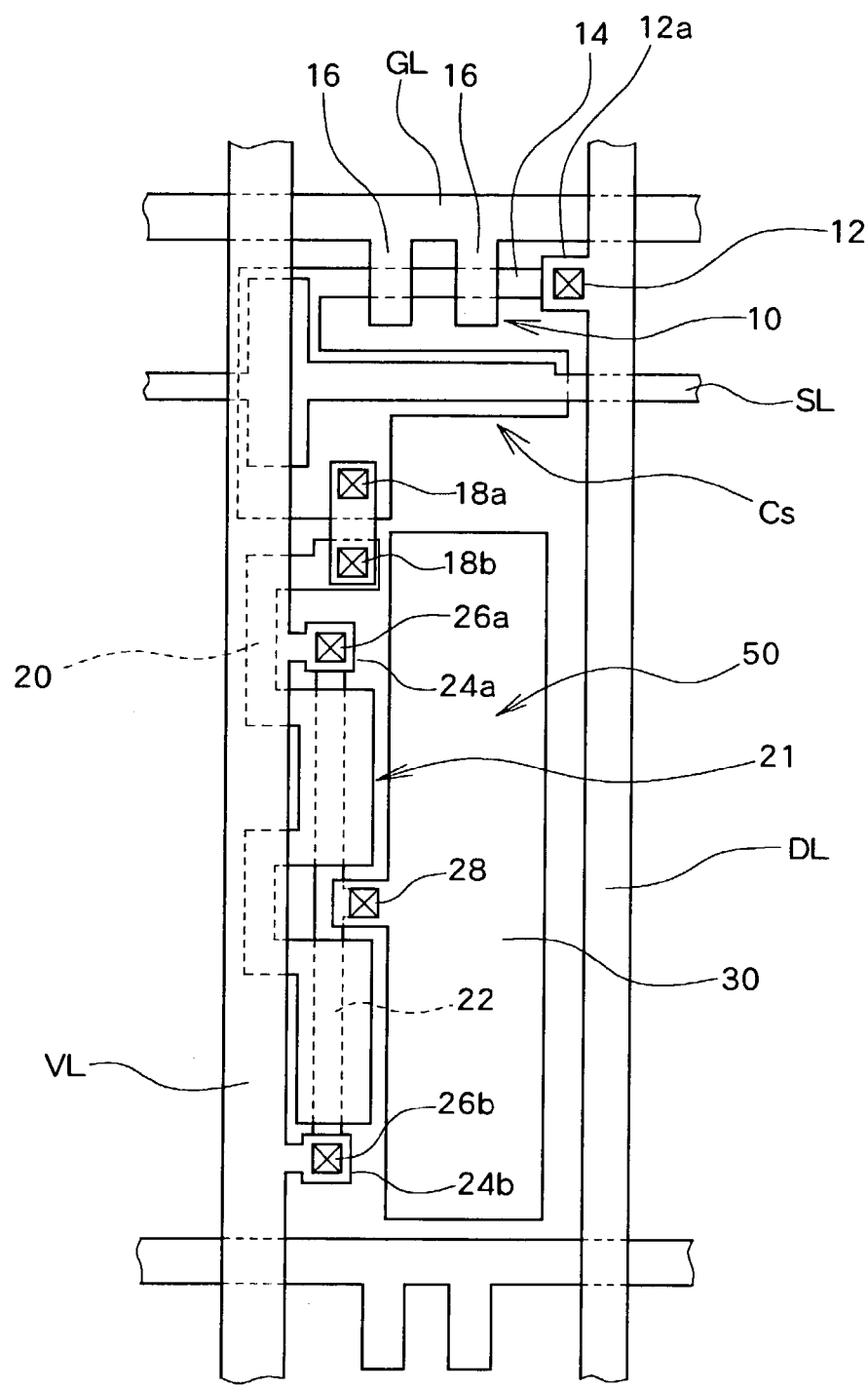
FIG. 1 is a plan view of a structure according to a preferred embodiment of the present invention.
Figure 4:
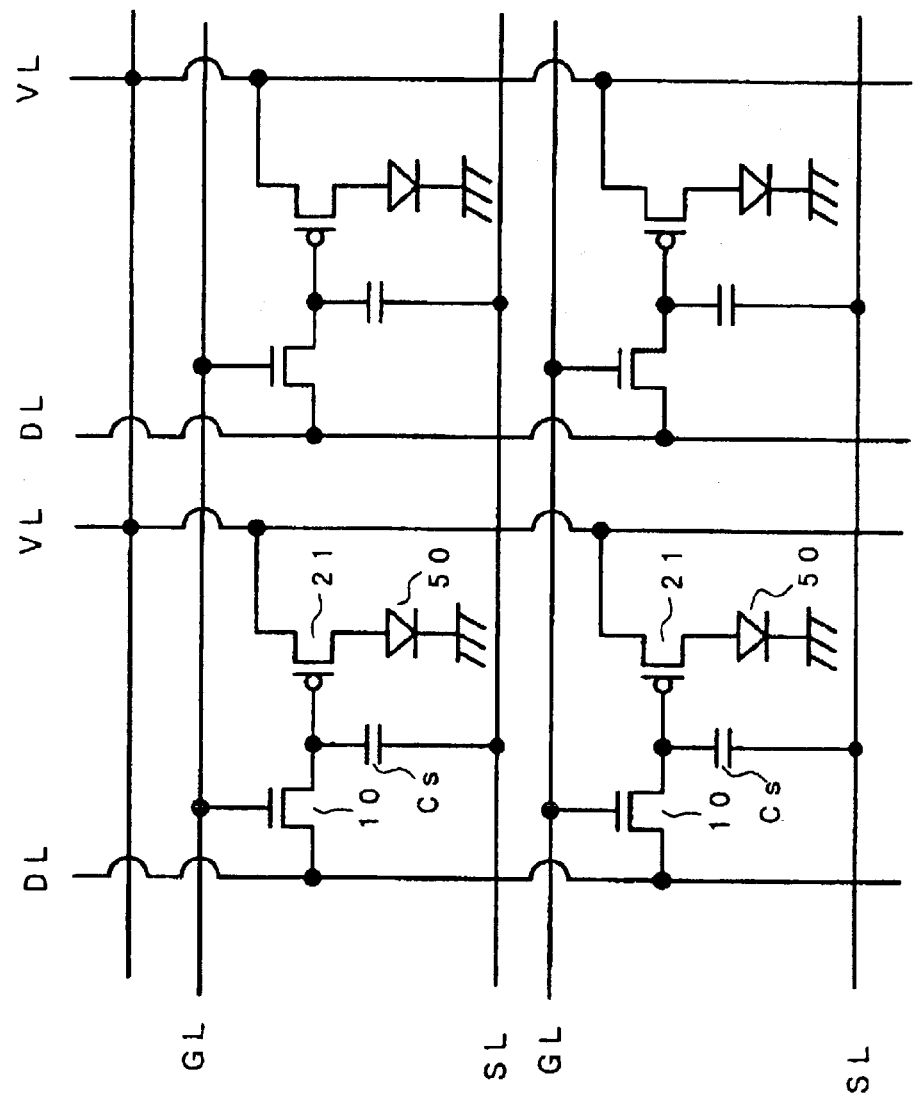
FIG. 4 is a diagram showing a structure of a pixel circuit.

A preferred embodiment of the present invention (hereinafter referred to simply as an "embodiment") will now be described with reference to the drawings. FIG. 1 is a plan view schematically showing a structure of a pixel according to the embodiment. The circuit structure is identical to that shown in FIG. 4 and described above.

As shown in FIG. 1, a plurality of data lines DL and a plurality of power supply lines VL are provided along the column (vertical) direction in a predetermined pitch and a plurality of gate lines GL are provided along the row (horizontal) direction with a predetermined pitch. A first TFT 10, a second TFT 21, a capacitor Cs, and an organic EL element 50 are formed in a pixel area surrounded by the data line DL, the gate lines GL, and the power supply line VL,.

The data line DL is made of, for example, aluminum, and the drain of the first TFT 10 is connected to the data line DL through a contact 12. Here, a protruding section 12a protruding towards the inside of the pixel region is provided in the data line DL at the upper right position of the pixel region in FIG. 1 and the contact 12 is formed in the protruding section 12a. With such a structure, the width of a portion of the data line DL through which current flows is not reduced due to the contact 12.

The first TFT 10 has a semiconductor layer 14 provided on a glass substrate and made of polycrystalline silicon. One end of the semiconductor layer 14 extends to a region below the protruding section 12a of the data line DL and is connected to the protruding section 12a by a contact 12 which extends in the thickness direction.

The contact 12 forms a drain region of the first TFT 10. The semiconductor layer 14 extends along the row direction and two gate electrodes 16 are placed above the semiconductor layer 14 via a gate insulating film. The gate electrode 16 is formed to protrude from a gate line GL in the downward direction of the page (toward the inside of the pixel region) which is made of, for example, Mo or Cr. A region in the semiconductor layer 14 below the gate electrode 16 is the channel region of the semiconductor layer 14 and the end portion opposite of the drain region is the source region.

The semiconductor layer 14 further extends and forms an electrode of a capacitor Cs. The capacitor Cs is formed between the semiconductor layer 14 and a capacitor electrode which opposes the semiconductor layer 14 via a dielectric layer, and the capacitor electrode is formed as a portion of the capacitor line SL. The capacitor line may also made of, for example, Mo or Cr.

The semiconductor layer 14 made of polycrystalline silicon further extends from the electrode portion of the capacitor Cs in the downward direction of the page and is connected to a gate electrode 20 of the second TFT via a pair of contacts 18a and 18b which are connected by aluminum. The gate electrode 20 is made of, for example, Mo. The second TFT 21 has a semiconductor layer 22. The ends of the semiconductor layer 22 form drain regions to be connected to the power supply line VL, a central section of the semiconductor layer 22 forms a source region to be connected to the organic EL element 50, and a region between the drain region and the source region and above which a gate electrode 20 is placed via a gate insulating film forms a channel region.

The semiconductor layer 22 which is a part of the second TFT 21 has an elongated shape extending along the power supply line VL. Portions of the power supply line VL protrude in a region above in the thickness direction of the pair of drain regions at the upper and lower ends in FIG. 1 of the semiconductor layer 22, and form a pair of protruding sections 24a and 24b. Contacts 26a and 26b are formed on the pair of protruding sections 24a and 24b so that the power supply line VL and the pair of drain regions of the second TFT 21 are connected.

Figure 2:
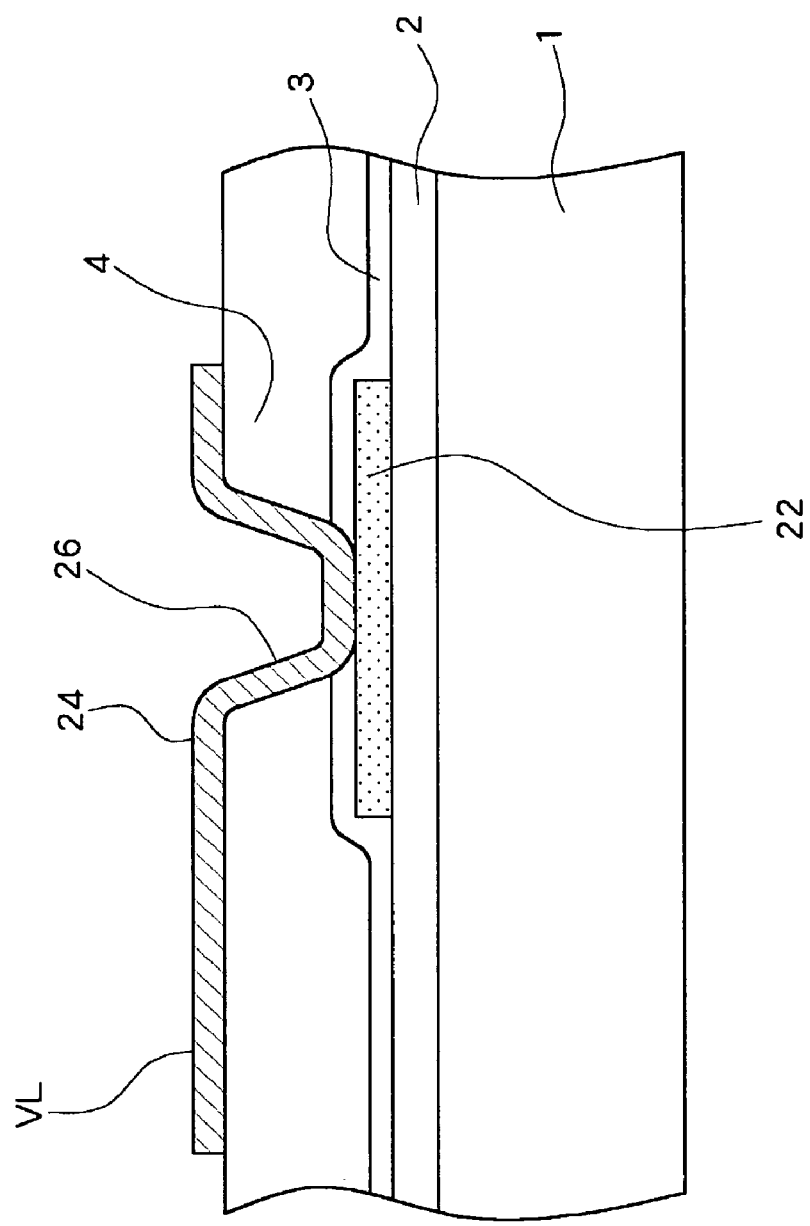
FIG. 2 is a cross sectional view showing a structure around a contact 26 in a preferred embodiment of the present invention.

FIG. 2 shows a cross section of this region. A portion of the power supply line VL protrudes towards the inside of the pixel region to form a protruding section 24. The end portion of the protruding section 24 is connected to the drain region of the semiconductor layer 22 as a contact 26. An insulating layer 2 made of $SiO_2$ or SiN is formed on the glass substrate 1 and the semiconductor layer 22 is formed on the insulating layer 2. A gate insulating film 3 is formed on the semiconductor layer 22 and an interlayer insulating film 4 is formed on the gate insulating film 3. A contact hole is formed through the gate insulating film 3 and through the interlayer insulating film 4, and the contact 26 is formed in the contact hole by depositing aluminum identical to the power supply line VL.

In this manner, because the contact 26 is formed in the protruding section 24, the contact 26 does not force reduction of the width of the portion of the power supply line through which current flows.

Figure 5:
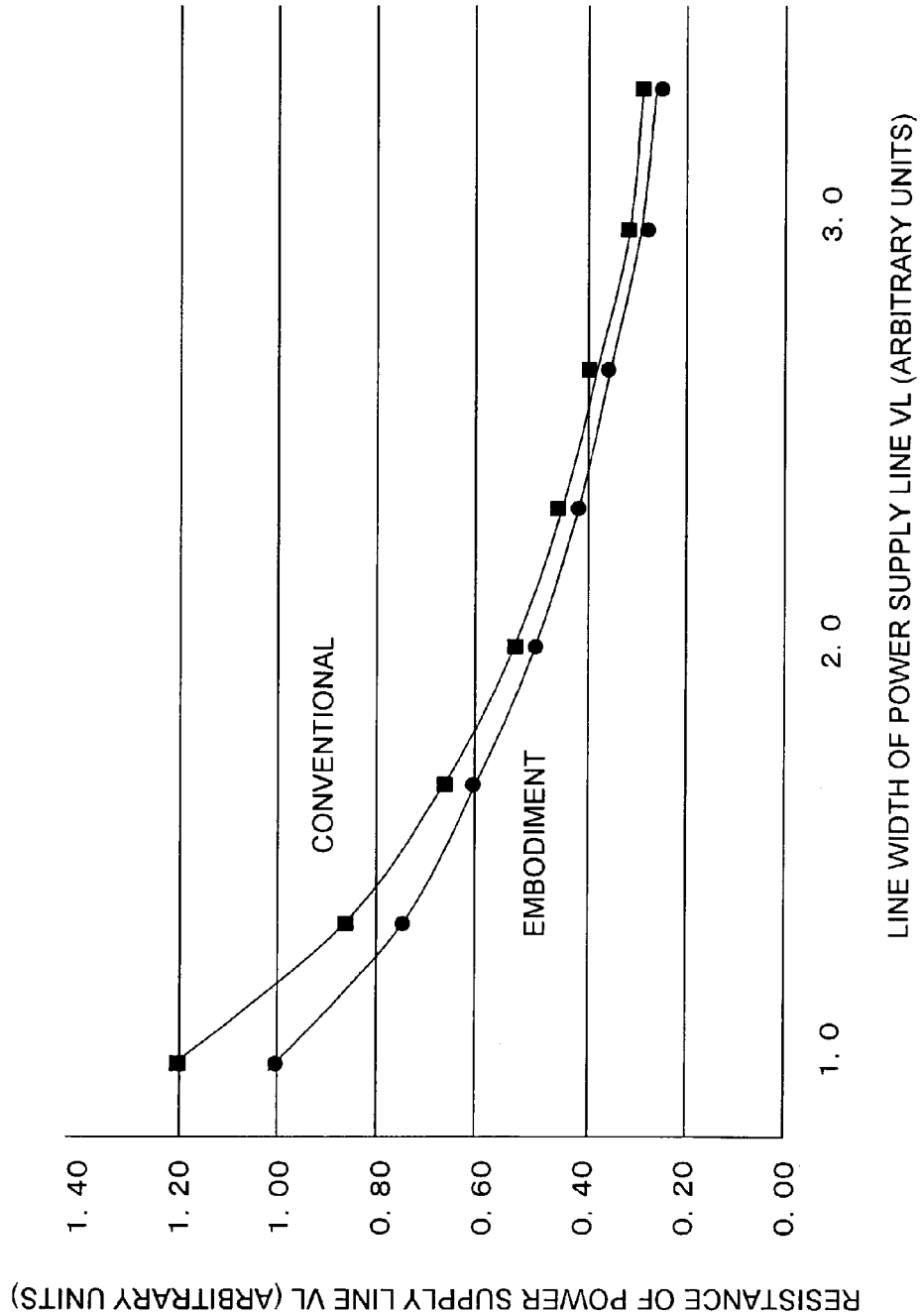
FIG. 5 is a diagram showing advantages of the structure wherein contact is provided off the power supply line VL.

FIG. 5 shows advantages of forming the contact off line from the power supply line VL, i.e. the contact is not formed on the power supply line VL. FIG. 5 shows a relationship between the line width of the power supply line VL and the resistance of the power supply line VL. In FIG. 5, two plots are shown, one for a case wherein the contact 26 is provided off line from the main extension line of the power supply line VL as described in the embodiment (labeled "embodiment") and the other for a case wherein the contact is placed on the main extension line of the power supply line VL (labeled "conventional"). From FIG. 5, it can be seen that the resistance in the power supply line VL can be reduced in the structure of the embodiment.

In addition, as shown in FIG. 1, the gate electrode 20 extends from the portion where the pair of contacts 18a and 18b are provided to a region below the power supply line VL; extends in the downward direction of FIG. 1 below the power supply line VL; and extends towards the inside of the pixel region (in the direction to the right in FIG. 1) to a region above the semiconductor layer 22. The gate electrode 20 further extends in the downward direction of FIG. 1 above the channel region of the semiconductor layer 22, extends again below the power supply line VL in the thickness direction to detour around the source region, and again extends to a region above the semiconductor layer 22. Therefore, the gate electrode 20 does not extend into a region within the pixel region which is internal to the semiconductor layer 22, that is, to the emissive region (anode 30). Because of this, the emissive region is not covered by the gate electrode 20, and it is possible to prevent a decrease in the emissive area.

A contact 28 is provided in the source region of the second TFT 21 and connects the source region and the anode 30 of the organic EL element 50. The anode 30 is made of a transparent electrode formed from, for example, ITO and IZO. The organic EL element 50 further comprises an organic layer including an organic emissive layer formed on the anode 30 and a cathode formed on the organic layer.

Figure 3:
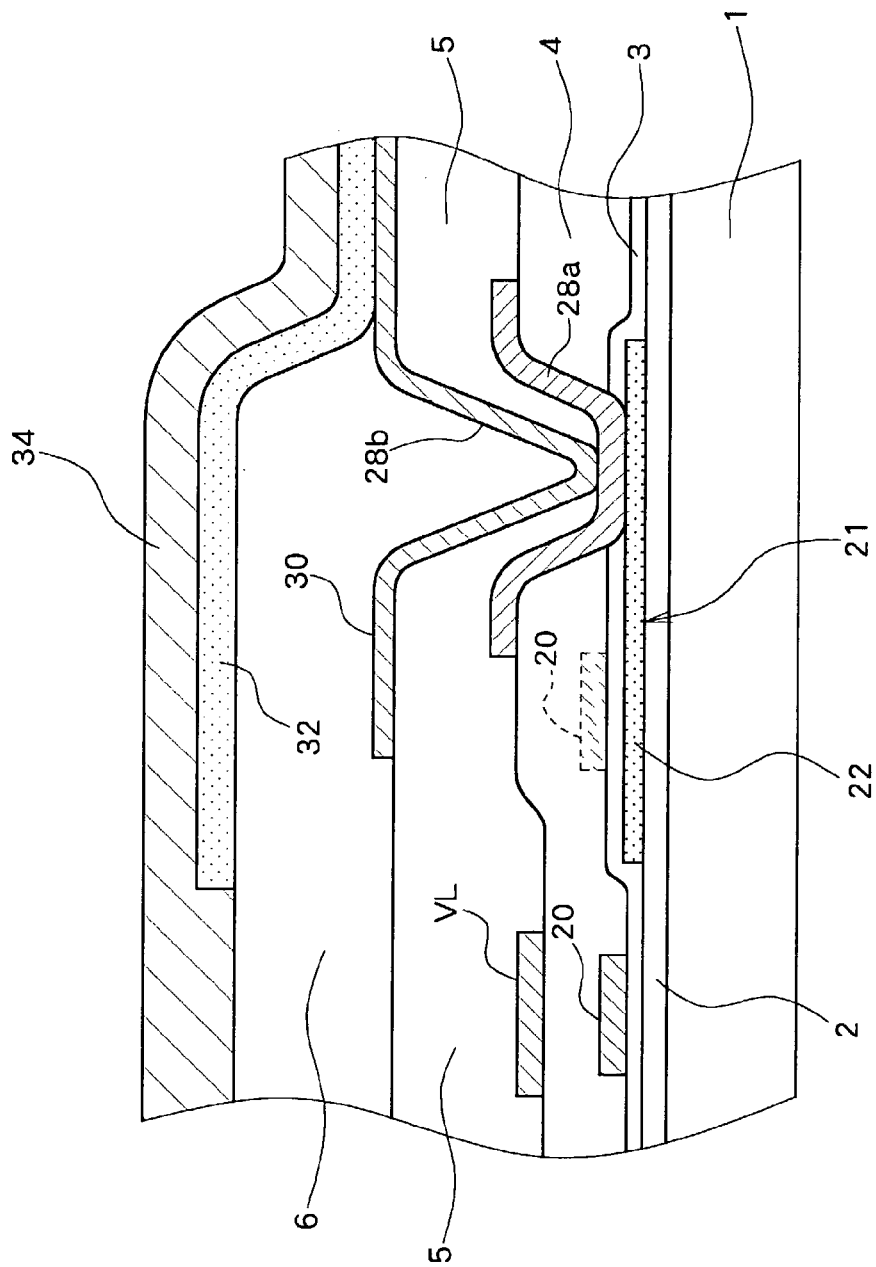
FIG. 3 is a cross sectional view showing a structure around a contact 28 in a preferred embodiment of the present invention.

FIG. 3 is a cross sectional view showing the contact 28 and the region around the contact 28. As shown in FIG. 3, an insulating film 2 made of, for example, $SiO_2$ or SiN is formed on the glass substrate 1 and a semiconductor layer 22 which forms a part of the second TFT 21 is formed on the insulating film 2. In addition, the semiconductor layer 22 is covered by a gate insulating film 3. Although FIG. 3 shows the cross sectional structure of a source region doped with impurities, in FIG. 3, in addition to the gate electrode 20 placed in the channel region, the gate electrode 20 positioned below the power supply line VL is also shown for illustrating purposes (in actuality, this electrode covers the semiconductor layer 22). The portion of the gate electrode 20 which actually functions as a gate electrode is shown by a dotted line.

The source region extends towards the inside of the pixel area, and a first contact 28a made of aluminum is formed above the extended source region. The first contact 28a is formed to cover a contact hole formed through a portion of the gate insulating film 3 and the interlayer insulating film 4 (for example, a layered film of SiNx and $SiO_2$) which covers the gate electrode 20. The power supply line VL is also formed on the interlayer insulating film 4.

A first planarization film 5 is formed above the first contact 28a and above the interlayer insulating film 4, and a contact hole is formed through the first planarization film 5 above the first contact 28a. A portion of the anode 30 extends in the contact hole as a contact 28b. In other words, a portion of the anode 30 is directly connected to the source region of the semiconductor layer 22 through the contact 28 in a form of double contacts. In this manner, because one end of the anode 30 is directly connected to the contact 28, it is possible to form the anode 30 in an approximate rectangular shape, and, consequently, an organic EL element 50 having a sufficiently large area can be obtained.

An organic layer 32 comprising a hole transport layer, an organic emissive layer, and an electron transport layer is provided on the anode 30 and a cathode 34 is provided over the organic layer 32 to form an organic EL element 50. A second planarization film 6 is formed above a portion of the anode 30 above the contact 28 which does not function as a pixel and a portion above the first planarization film 5.

In this manner, according to the present embodiment, the contacts 26a and 26b are not placed in a portion of the power supply line VL through which the current primarily flows and is placed off line from the primary flow path of the current. With this structure, it is possible to maintain a low resistance for the power supply line VL and maintain sufficient current supply capability to the organic EL element 50 of each pixel. Consequently, the width of the power supply line VL can be reduced while the aperture ratio which is a ratio of the area of the emissive region to the overall area is simultaneously increased. In addition, because a portion of the power supply line VL is extended to a region above the semiconductor layer 22 and a contact is formed on this portion, the semiconductor layer 22 can be formed in an approximate straight shape. Therefore, in comparison to a case wherein the semiconductor layer 22 is extended to a region below the power supply line VL, the length of the semiconductor layer 22 can be reduced, the electrical resistance of the semiconductor layer 22 can be reduced, and the operation of the second TFT 21 can be stabilized. In addition, because a portion of the line for the gate electrode 20 is provided below the power supply line VL, the aperture ratio can be increased.

As described, in the configuration according to the embodiment, contacts are not placed on a portion of the power supply line through which current primarily flows and are instead placed off line from the primary flow path. With such a structure, it is possible to keep the resistance of the power supply line VL low and maintain sufficient current supply capability to the organic EL element 50 in each pixel. Consequently, the width of the power supply line VL can be reduced and the aperture ratio which is the ratio of the area of the emissive region to the overall area can be increased.

In addition, by placing a portion of the line for the gate below the power supply line, it is possible to increase the aperture ratio.

Moreover, because a portion of the power supply line is extended to a region above the semiconductor layer and a contact is provided in that region, the semiconductor layer can be formed in an approximate straight shape. With such a structure, in comparison to a structure wherein the semiconductor layer is extended to a region below the power supply line, the length of the semiconductor layer can be reduced, the electrical resistance of the semiconductor layer can be reduced, and the operation of the second TFT can be stabilized.

What is claimed is:

1. A display device having a plurality of current driven self-emissive elements formed on a substrate and wherein display is achieved by controlling the current to the self-emissive elements, the display device comprising:

a current control transistor provided corresponding to each of the self-emissive elements for controlling current from a power supply line to the corresponding self-emissive element, wherein one terminal of the current control transistor and of the power supply line are placed at different positions in the thickness direction and are connected through a contact, and the contact is connected to the power supply line at a connecting portion which protrudes from the power supply line;

the connecting portion protrudes from the power supply line in a planer direction which is substantially parallel to the substrate surface;

the current control transistor is a thin film transistor; and a portion of a line for a gate for supplying a control voltage to a gate electrode is placed at a position different from the power supply line in the thickness direction and overlapping the power supply line in the planar direction.

2. A display device according to claim 1, wherein the other terminal of the current control transistor is connected to the corresponding self-emissive element through a contact of self-emissive element side; and the gate line is placed at a position overlapping the power supply line in the planer direction so that the gate line bypasses the connection contact with the self-emissive element.

3. A display device according to claim 1, wherein the current control transistor has a polycrystalline silicon semiconductor layer elongated along the power supply line; and the connection portion extends to a region above a drain region of the polycrystalline silicon semiconductor layer, and the contact is provided on this portion.

4. A display device having a plurality of current driven self-emissive elements formed on a substrate and wherein display is achieved by controlling the current to the self-emissive elements, the display device comprising:

a current control transistor provided corresponding to each of the self-emissive elements for controlling current from a power supply line to the corresponding self-emissive element, wherein one terminal of the current control transistor and of the power supply line are placed at different positions in the thickness direction and are connected through a contact, and the contact is connected to the power supply line at a connecting portion which protrudes from the power supply line;

the connecting portion protrudes from the power supply line in a planer direction which is substantially parallel to the substrate surface;

the current control transistor has a polycrystalline silicon semiconductor layer elongated along the power supply line; and both ends of the polycrystalline silicon semiconductor layer form a pair of drain regions;

regions internal to the drain regions form a pair of channel regions;

a central region forms a common source region;

a pair of gate electrodes are placed above the pair of channel regions via a gate insulating film; and the pair of gate electrodes are connected to each other through a connection line placed at a position different from the power supply line in the thickness direction and overlapping the power supply line in the planer direction.

* * * * *